(12) United States Patent
Hashiba et al.

(10) Patent No.: US 12,469,813 B2
(45) Date of Patent: Nov. 11, 2025

(54) HEAT RADIATION STRUCTURE AND ELECTRONIC APPARATUS

(71) Applicant: LENOVO (SINGAPORE) PTE. LTD., Singapore (SG)

(72) Inventors: Junki Hashiba, Yokohama (JP); Takuroh Kamimura, Yokohama (JP); Masahiro Kitamura, Yokohama (JP); Ryota Watanabe, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 413 days.

(21) Appl. No.: 18/338,453

(22) Filed: Jun. 21, 2023

(65) Prior Publication Data
US 2024/0038710 A1    Feb. 1, 2024

(30) Foreign Application Priority Data

Jul. 28, 2022 (JP) ................................ 2022-120589

(51) Int. Cl.
*H01L 23/00* (2006.01)
*H01L 23/373* (2006.01)
(Continued)

(52) U.S. Cl.
CPC .......... *H01L 24/29* (2013.01); *H01L 23/3733* (2013.01); *H01L 24/32* (2013.01);
(Continued)

(58) Field of Classification Search
CPC . H01L 23/4275; H01L 23/3733; H01L 24/32; H01L 24/29; H01L 25/16; H01L 23/3736; H01L 23/42; H01L 23/3738; H01L 23/367; H01L 23/22; H01L 23/3675; H01L 21/4882; H01L 23/427; H01L 23/04; H01L 2224/29013; H01L 2224/29017; H01L 2224/2919; H01L 2924/10158;
(Continued)

(56) References Cited

U.S. PATENT DOCUMENTS 5,323,294 A * 6/1994 Layton .................... H01L 24/29
257/E23.09
5,459,352 A * 10/1995 Layton ................ H01L 23/3733
257/E23.09
(Continued)

FOREIGN PATENT DOCUMENTS

JP    2003332505 A    11/2003
JP    2004146819 A    5/2004
(Continued)

OTHER PUBLICATIONS

EP search report, dated Dec. 11, 2023, in application No. 23186561.9-1211.

*Primary Examiner* — Mouloucoulaye Inoussa
(74) *Attorney, Agent, or Firm* — SHIMOKAJI IP

(57) ABSTRACT

A heat radiation structure includes a vapor chamber provided along a surface of a die, a mesh interposed between the die and the vapor chamber, and a liquid metal impregnated in the mesh. In the mesh, a peripheral portion has a higher material density per unit volume than a central portion. In the mesh, the central portion may be formed of a single layer, and the peripheral portion is formed of two layers. The mesh may be a resin material.

8 Claims, 5 Drawing Sheets

(51) Int. Cl.
*H01L 23/427* (2006.01)
*H01L 25/16* (2023.01)

(52) U.S. Cl.
CPC ............ *H01L 23/427* (2013.01); *H01L 25/16* (2013.01); *H01L 2224/29011* (2013.01); *H01L 2224/29013* (2013.01); *H01L 2224/29017* (2013.01); *H01L 2224/29076* (2013.01); *H01L 2224/29082* (2013.01); *H01L 2224/29105* (2013.01); *H01L 2224/29124* (2013.01); *H01L 2224/29147* (2013.01); *H01L 2224/29188* (2013.01); *H01L 2224/2919* (2013.01); *H01L 2224/29655* (2013.01); *H01L 2224/32245* (2013.01); *H01L 2924/0675* (2013.01); *H01L 2924/10158* (2013.01)

(58) Field of Classification Search
CPC . H01L 2224/29188; H01L 2224/29124; H01L 2224/29655; H01L 2224/29082; H01L 2224/29147; H01L 2224/29105; H01L 2224/29011; H01L 2924/0675; H01L 2224/29076; C09K 5/14; B05C 9/12; C09D 5/38; B05D 5/12

See application file for complete search history.

(56) References Cited

U.S. PATENT DOCUMENTS

| | | | |
|---|---|---|---|
| 12,381,125 B1* | 8/2025 | Shen | H01L 23/3736 |
| 2002/0108743 A1 | 8/2002 | Wirtz | |
| 2005/0228097 A1* | 10/2005 | Zhong | B82Y 30/00 |
| | | | 524/439 |
| 2006/0157223 A1 | 7/2006 | Gelorme | |
| 2007/0163755 A1 | 7/2007 | Kim | |
| 2018/0305563 A1* | 10/2018 | Oh | C09D 133/02 |
| 2021/0045251 A1* | 2/2021 | Ma | B41M 1/22 |
| 2021/0066160 A1* | 3/2021 | Lee | C09K 5/14 |
| 2021/0337696 A1* | 10/2021 | Lin | H05K 7/205 |
| 2022/0262538 A1* | 8/2022 | Li | H01B 1/22 |
| 2022/0344237 A1* | 10/2022 | Deng | H01L 23/3736 |
| 2022/0367524 A1* | 11/2022 | Park | H10D 86/441 |
| 2023/0014476 A1* | 1/2023 | Huang | H01L 23/3135 |
| 2024/0038621 A1* | 2/2024 | Strogies | H01L 23/3733 |

FOREIGN PATENT DOCUMENTS

| | | |
|---|---|---|
| JP | 2008205383 A | 9/2008 |
| WO | 9423450 A1 | 10/1994 |

* cited by examiner

HEAT RADIATION STRUCTURE AND ELECTRONIC APPARATUS

BACKGROUND OF THE INVENTION

Field of the Invention

The present invention relates to a heat radiation structure of an electric component that generates heat, and an electronic apparatus.

Description of the Related Art

A semiconductor chip, such as a GPU, a CPU, or the like, is provided in a portable information apparatus, such as a laptop PC or the like. The GPU and the CPU have a shape having a substrate which is a portion to be mounted on a board and a die having a rectangular shape and provided on a surface of the substrate. In some cases, a small capacitor is provided in the periphery of the die on the surface of the substrate.

The semiconductor chip, such as the GPU, the CPU, or the like, is a heat generation element, and it is necessary to radiate heat depending on the power consumption (particularly under high load). In some cases, a heat radiation element, such as a vapor chamber, a heat spreader, a heat sink, or the like, is used as means for radiating heat from the GPU or the CPU to diffuse heat by causing such a heat radiation element to abut on the surface of the die. In some cases, a fluid, such as a liquid metal, grease having a heat transfer property, or the like, is interposed between the die and the heat radiation element in order to efficiently transfer heat (for example, Japanese Unexamined Patent Application Publication No. 2004-146819).

SUMMARY OF THE INVENTION

The liquid metal has higher heat transfer property than the grease having the heat transfer property, and can effectively transfer heat from the die to the heat radiation element. On the other hand, the liquid metal has a characteristic of having higher fluidity than the grease having the heat transfer property. In a case in which the electronic apparatus is carried and moved, it is susceptible to vibration or impact. Then, the liquid metal having fluidity has a concern of leaking from a gap between the die and the heat radiation element due to a repetitive force received from the die and the heat radiation element.

It is considered that, in a case in which an amount of leakage of the liquid metal is small, there is almost no influence on the periphery, but in a case in which an amount of the liquid metal between the die and the heat radiation element is decreased, the heat transfer performance is deteriorated accordingly. In order to suppress the leakage of the liquid metal, the inventors of the present application have studied to provide a porous material impregnated with the liquid metal between the die and the heat radiation element. Examples of the porous material include a mesh. In a case in which the liquid metal is impregnated in the mesh, the liquid metal is less likely to leak.

In order to suppress the leakage of the liquid metal, it is desirable that a material density of the mesh is high. However, in order to make it easier for the mesh to be impregnated with the liquid metal at a manufacturing and assembling stage, it is desirable that the material density of the mesh is low. In addition, considering the heat transfer property, in order to hold as much liquid metal as possible between the die and the heat radiation element, it is desirable that the material density of the mesh is low.

The present invention has been made in view of the above problems, and is to provide a heat radiation structure and an electronic apparatus capable of achieving both the suppression of leakage of a liquid metal and the realization of high heat transfer performance.

In order to solve the above-described problems and achieve an object, a first aspect of the present invention relates to a heat radiation structure of an electric component that generates heat, the heat radiation structure including a heat radiation element provided along a surface of the electric component, a porous material interposed between the electric component and the heat radiation element, and a liquid metal impregnated in the porous material, in which, in the porous material, a peripheral portion has a higher material density per unit volume than a central portion.

A second aspect of the present invention relates to an electronic apparatus including an electric component that generates heat, a heat radiation element provided along a surface of the electric component, a porous material interposed between the electric component and the heat radiation element, and a liquid metal impregnated in the porous material, in which, in the porous material, a peripheral portion has a higher material density per unit volume than a central portion.

In the above-described aspects of the present invention, since the liquid metal is impregnated in the mesh, the liquid metal does not leak to the periphery. In particular, the material density is high in the peripheral portion of the mesh, a capillary action takes place, and the leakage of the liquid metal can be further prevented. On the other hand, the central portion of the mesh has a relatively low material density and has a larger relative impregnation amount of the liquid metal per unit volume than the peripheral portion in which the material density is relatively high, and thus high heat transfer property is realized. As described above, the above-described aspects of the present invention can achieve both the suppression of the leakage of the liquid metal and the realization of high heat transfer performance.

DETAILED DESCRIPTION OF THE INVENTION

Hereinafter, an embodiment of a heat radiation structure and an electronic apparatus according to the present invention will be described in detail based on the drawings. It should be noted that the present invention is not limited to the embodiment.

Figure 1:
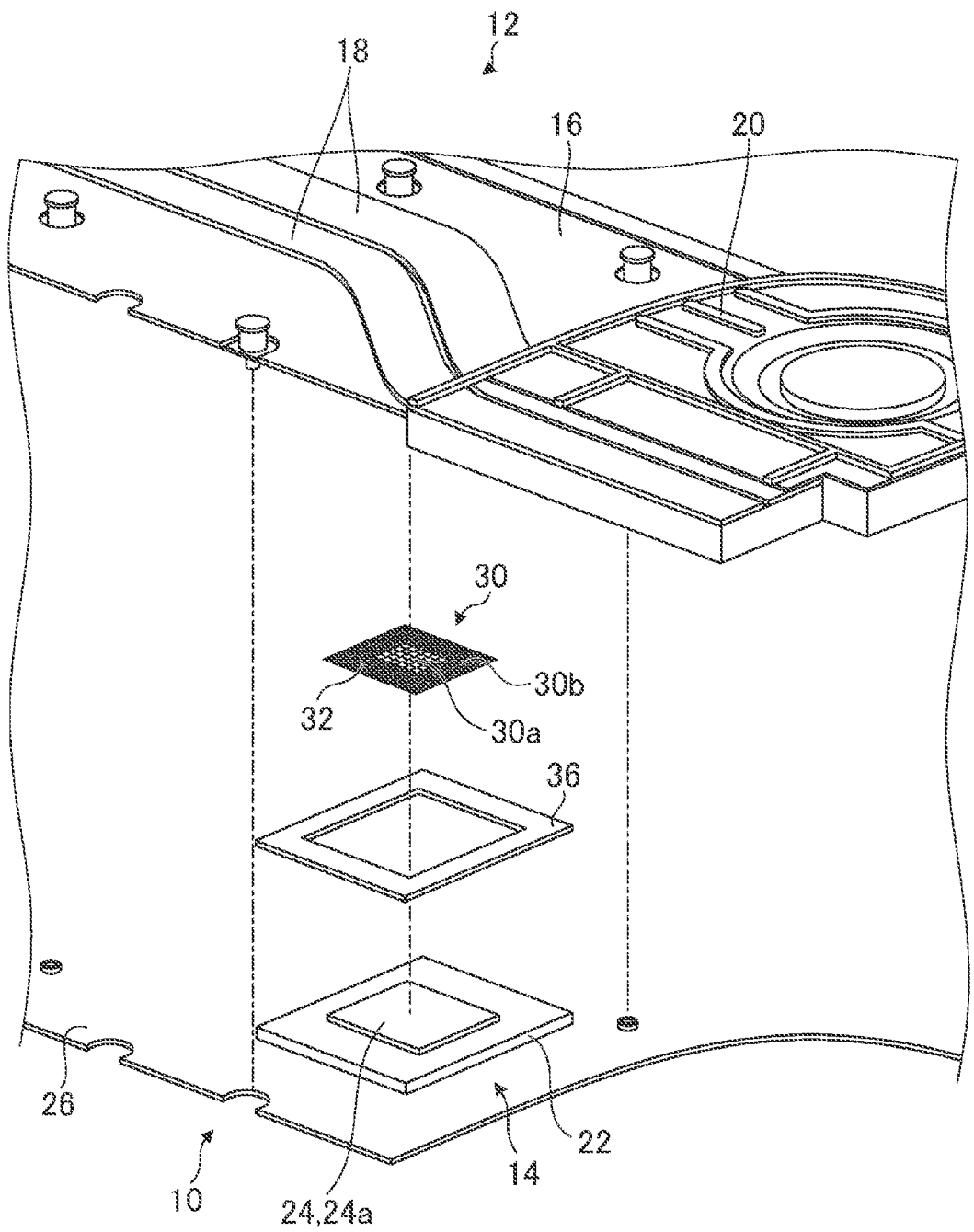
FIG. 1 is an exploded perspective view illustrating a part of a heat radiation structure and a portable information apparatus according to an embodiment of the present invention.

FIG. 1 is an exploded perspective view illustrating a part of a heat radiation structure 10 and a portable information apparatus (electronic apparatus) 12 according to the embodiment of the present invention. The portable information apparatus 12 is, for example, a laptop PC, a tablet terminal, a smartphone, or the like, and includes a graphics processing unit (GPU) 14. Although the heat radiation structure 10 is suitably used for the portable information apparatus 12, the heat radiation structure 10 can also be applied to an electronic apparatus, such as a stationary desktop computer or the like. The GPU 14 is a semiconductor chip capable of performing real-time image processing. Since the GPU 14 performs high-speed computing, a corresponding amount of heat is generated, and thus heat radiation means is required. The portable information apparatus 12 includes a vapor chamber (heat radiation element) 16 as the heat radiation means of the GPU 14.

The vapor chamber 16 is in a form of a plate in which peripheral edge portions of two metal plates (for example, a copper plate) are joined to form a closed space inside, and heat can be diffused with high efficiency by a phase change of a working fluid enclosed in the closed space. A wick that delivers the condensed working fluid by a capillary phenomenon is disposed in the closed space of the vapor chamber 16.

Two substantially parallel heat pipes 18 are provided in the vapor chamber 16, and further end portions of the heat pipes 18 are connected to a fan 20. The heat pipe 18 encloses the working fluid in a closed space formed in a thin and flat metal pipe, and a wick is provided as in the vapor chamber 16.

As the heat radiation means of the heat generation element, such as the GPU 14 or the like, various heat radiation elements other than the vapor chamber 16 can be applied. Examples of the heat radiation element include a metal plate, such as copper, aluminum, or the like having high heat conductivity, a graphite plate, a heat lane, a heat sink, and the like.

Figure 2:
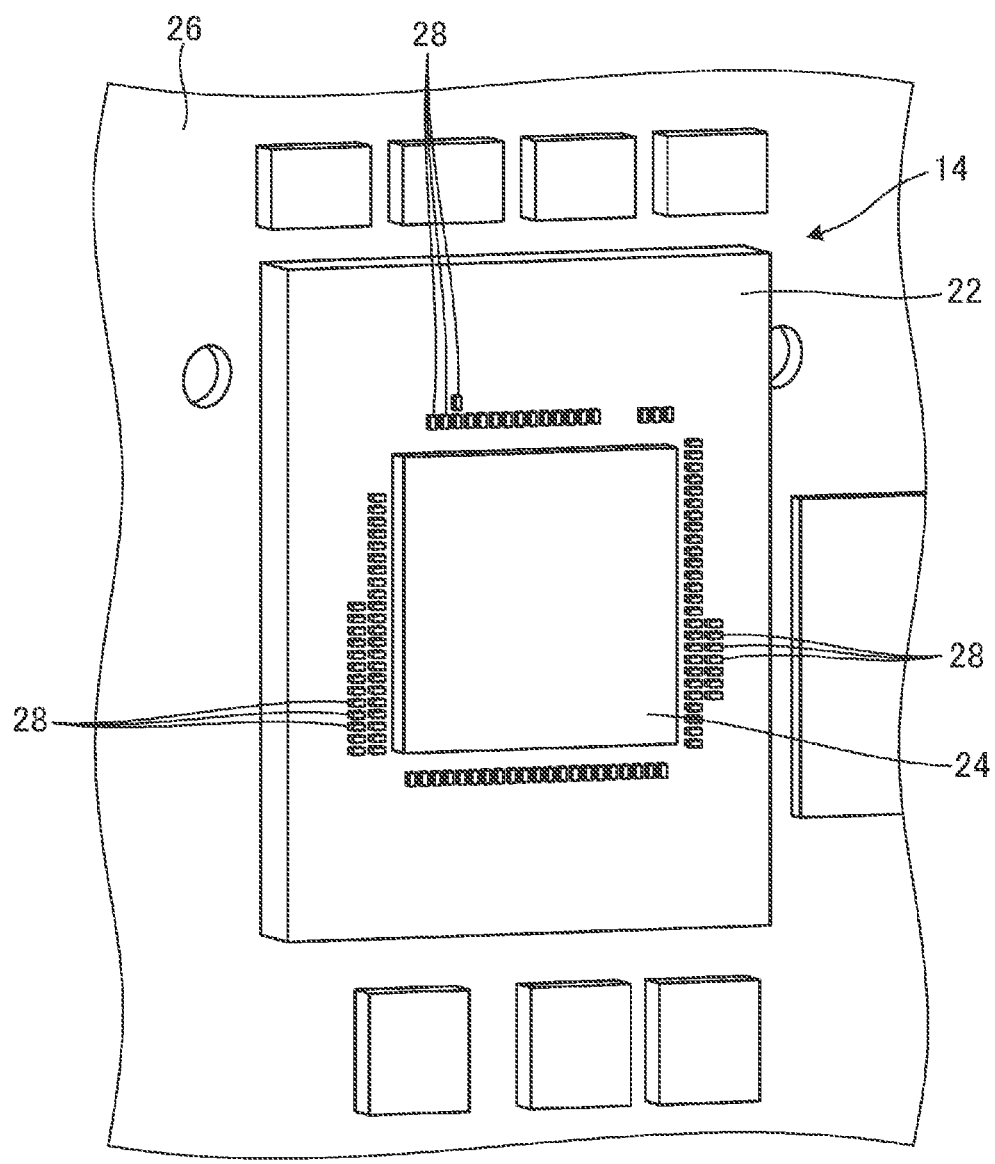
FIG. 2 is a perspective view of a GPU.

FIG. 2 is a perspective view of the GPU 14. The GPU 14 includes a substrate 22 and a die (electric component) 24. The substrate 22 is a thin plate-shaped portion that is mounted on the board 26, and has a rectangular shape in a plan view. The die 24 is a portion including an arithmetic circuit, and is provided to slightly protrude from an upper surface of the substrate 22. The die 24 has a rectangular shape smaller than the substrate 22 in a plan view, and is provided at substantially the center of the upper surface of the substrate 22. The GPU 14 is one of the components that generate the most heat in the portable information apparatus 12, in particular, the die 24 generates heat.

Stated another way, the die 24 is one of the electric components in the portable information apparatus 12 that generates the most heat. It should be noted that the portable information apparatus 12 includes a central processing unit (CPU). Similar to the GPU, the CPU includes a substrate and a die, and the heat radiation structure 10 can be applied. Further, the heat radiation structure 10 can also be applied to heat radiation of the semiconductor chip other than the GPU 14 or the CPU, or other electric components that generate heat.

A number of small capacitors 28 are arranged on the upper surface of the substrate 22 to surround the die 24. The capacitors 28 are arranged on all sides of the die 24 in one or two rows depending on a location. The capacitors 28 are provided in a relatively close vicinity to the die 24. A height of the capacitor 28 is lower than a height of the die 24. The capacitors 28 are covered with an insulating material 34 (see FIG. 5). The insulating material 34 is, for example, an adhesive or an ultraviolet curable coating material, and is formed in a film shape.

Figure 3:
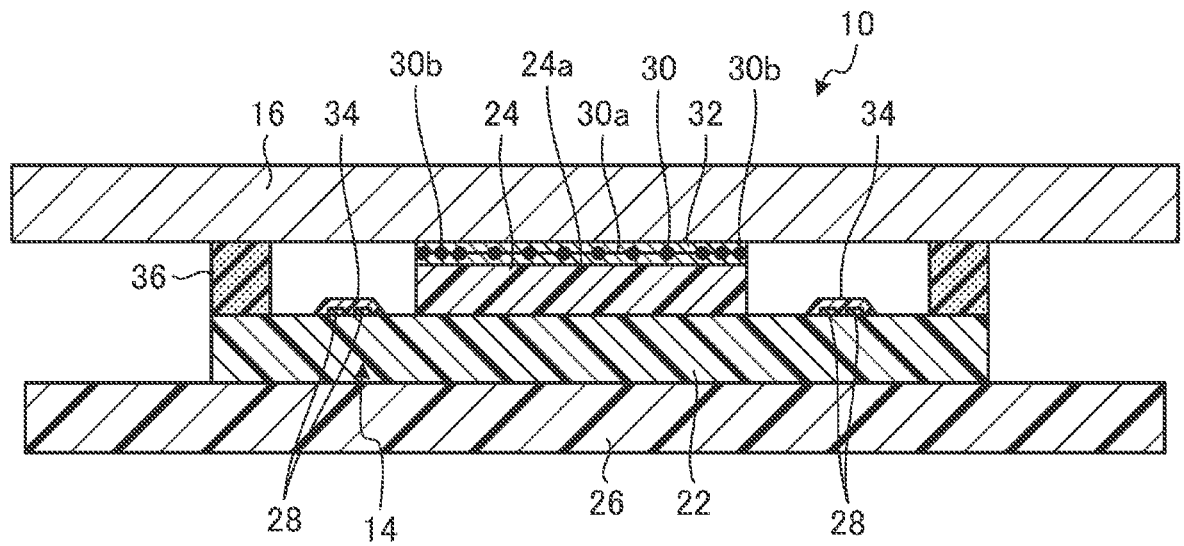
FIG. 3 is a schematic cross-sectional side view illustrating a first application example of the heat radiation structure.

FIG. 3 is a schematic cross-sectional side view illustrating a first application example of the heat radiation structure 10. As illustrated in FIG. 1 and FIG. 3, the heat radiation structure 10 includes the vapor chamber 16 described above, a mesh (porous material) 30 interposed between a surface 24a of the die 24 and the vapor chamber 16, a liquid metal 32 impregnated in the mesh 30, the insulating material 34 that covers the capacitors 28, and an elastic material 36 provided between the substrate 22 and the vapor chamber 16. The elastic material 36 is, for example, a sponge. The vapor chamber 16 is thermally connected (thermal connection) to the surface 24a of the die 24 mainly via the liquid metal 32 impregnated in the mesh 30.

In this case, the surface 24a of the die 24 is a flat surface. The vapor chamber 16 is basically provided in parallel along the surface 24a of the die 24, but may be slightly non-parallel (substantially parallel) along the surface 24a of the die 24 as long as the liquid metal 32 abuts on the vapor chamber 16. Although not illustrated, a copper plate may be provided at a portion in the vapor chamber 16 facing the GPU 14, and the vapor chamber 16 may abut on the liquid metal 32 via the copper plate. In this case, the copper plate is also regarded as a part of the vapor chamber 16 that is the heat radiation element.

As will be described below, with the heat radiation structure 10, the liquid metal 32 impregnated in the mesh 30 hardly leaks to the periphery. However, the capacitors 28 can be protected further reliably by providing the insulating material 34, and further the liquid metal 32 can be further reliably prevented from leaking to the periphery by providing the elastic material 36. The insulating material 34 and the elastic material 36 may be omitted depending on design conditions.

Figure 4:
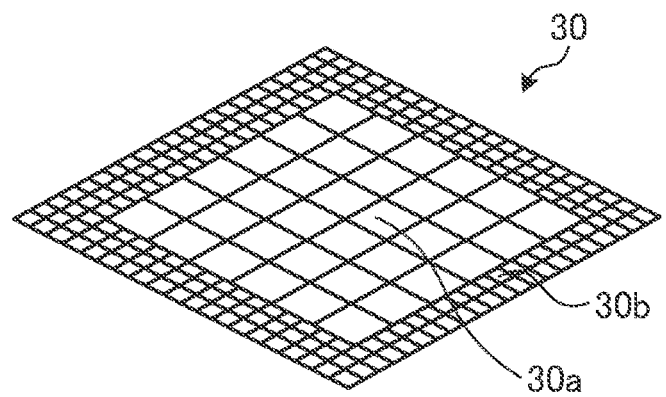
FIG. 4 is a schematic perspective view of a mesh.

FIG. 4 is a schematic perspective view of the mesh 30. The mesh 30 illustrated in FIG. 4 is representative and conceptual, and a specific example thereof will be described below (see FIG. 5).

The mesh 30 has a rectangular shape, and has a size that is the same as or slightly larger than the surface 24a of the die 24. A wire density of the mesh 30 is different between a central portion 30a and a peripheral portion 30b surrounding the central portion 30a. That is, the central portion 30a has a lower wire density than the peripheral portion 30b, and the peripheral portion 30b has a higher wire density than the central portion 30a. In a case in which the mesh 30 has a single-layer structure, the wire density is high at a location in which a wire interval is narrower in a plan view and low at a location in which the wire interval is wider. The wire density of the central portion 30a is, for example, 50 to 150 numbers/inch in terms of a single layer, and the wire density of the peripheral portion 30b is, for example, 100 to 300 numbers/inch in terms of a single layer.

However, as will be described below, the peripheral portion 30b of the mesh 30 may be formed of a plurality of layers, in some cases. Including a case of the single layer and a case of the plurality of layers, it is reasonable to compare the wire densities per unit volume in consideration of a thickness direction. For example, this is because it is considered that the wires in the upper and lower layers are close to each other and are dense even in a case in which the peripheral portion 30b of the mesh 30 has a plurality of layers and the wires overlap each other in a plan view. That is, it can be said that the mesh 30 according to the present example has a higher wire density per unit volume in the peripheral portion 30*b* than in the central portion 30*a*.

As the mesh 30, the mesh 30 in which the wire is knitted, the mesh 30 in which a large number of holes are provided in a plate material by etching or the like, or the like can be applied. The mesh 30 may be a resin material, such as polyester, glass fiber, or the like. In a case in which the mesh 30 is made of a metal material, suitable heat transfer performance can be obtained. In a case in which the mesh 30 is made of the resin material, the mesh 30 is less likely to damage the electric component that abuts on the mesh 30. A thickness of each single layer of mesh 30 is, for example, about 0.025 to 0.05 mm.

In a case in which the mesh 30 is made of a metal material, such as copper, aluminum, or the like, the mesh 30 plated with a nickel material (including an alloy containing nickel as a main component) may be used. That is, by using the nickel material in at least the surface of the mesh 30, it is possible to prevent the mesh 30 from being degenerated by the liquid metal 32. In a case in which the mesh 30 is made of the nickel material, the plating treatment can be omitted. Also, suitable thermal conductivity can be obtained by nickel-plating a copper material or an aluminum material.

The liquid metal 32 contains, for example, gallium as a main component, and is basically a metal that is a liquid at room temperature, but may be a phase change material or the like that is a liquid at a temperature in a normal use state in which at least the board 26 of the portable information apparatus 12 is energized to operate the GPU 14. Since the liquid metal 32 is the metal, the liquid metal 32 has excellent thermal conductivity and electric conductivity. In addition, since the liquid metal 32 is the liquid, the liquid metal 32 has fluidity. The liquid metal 32 is basically impregnated over almost the entire surface of the mesh 30.

As impregnating means, for example, the mesh 30 may be immersed in a tank of the liquid metal 32, or the liquid metal 32 may be applied to the mesh 30. In some cases, it is difficult to impregnate the liquid metal 32 in the mesh 30, but at this point in time, the handling is easy because the mesh 30 is a single unit before being incorporated into the heat radiation structure 10, and six up, down, front, back, left, and right surfaces are open, and thus it is easy to impregnate the liquid metal 32. In addition, since the mesh 30 is a single unit at this point in time, it is possible to visually observe or inspect whether the liquid metal 32 is properly impregnated or by predetermined means.

Figure 5:
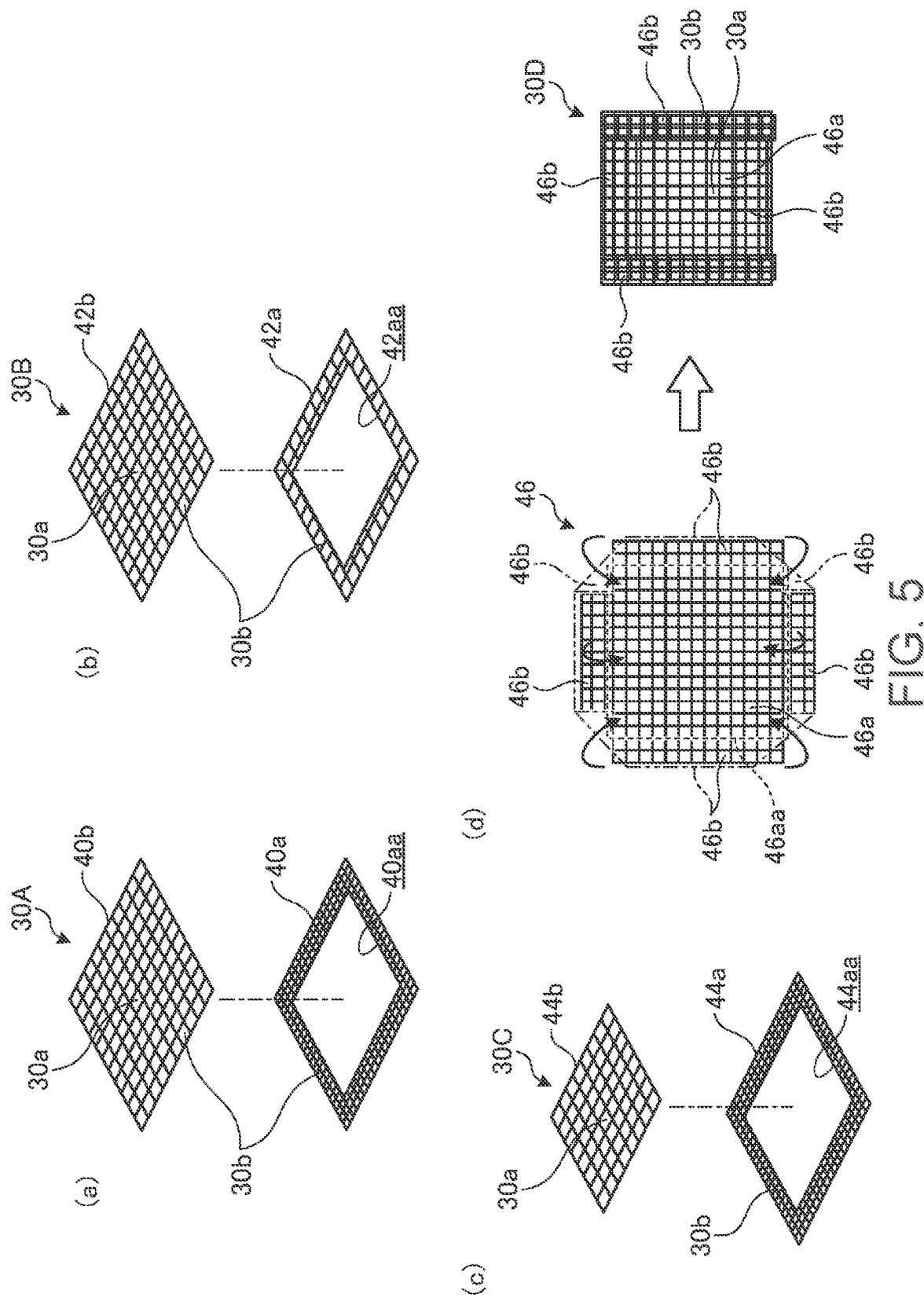
FIG. 5 is a diagram illustrating a specific example of a mesh, (a) is a schematic exploded perspective view illustrating a mesh according to a first specific example, (b) is a schematic exploded perspective view illustrating a mesh according to a second specific example, (c) is a schematic exploded perspective view illustrating a mesh according to a third specific example, and (d) is a schematic view for describing a manufacturing process of a mesh according to a fourth specific example.

FIG. 5 is a diagram illustrating the specific example of the mesh 30, (a) is a schematic exploded perspective view illustrating a mesh 30A according to a first specific example, (b) is a schematic exploded perspective view illustrating a mesh 30B according to a second specific example, (c) is a schematic exploded perspective view illustrating a mesh 30C according to a third specific example, and (d) is a schematic view for describing a manufacturing process of a mesh 30D according to a fourth specific example.

As illustrated in FIG. 5(*a*), the mesh 30A according to the first specific example is configured by overlapping a first mesh 40*a* and a second mesh 40*b* having the same outer shape. The wires of the first mesh 40*a* are dense, and the wires of the second mesh 40*b* are rough. An opening 40*aa* having a rectangular shape is formed in the center of the first mesh 40*a*. In the second mesh 40*b*, a single layer portion disposed in a range of the opening 40*aa* serves as the central portion 30*a*. A two-layer portion in which a portion of the first mesh 40*a* other than the opening 40*aa* and the second mesh 40*b* overlap each other serves as the peripheral portion 30*b*.

As illustrated in FIG. 5(*b*), the mesh 30B according to the second specific example is configured by overlapping a first mesh 42*a* and a second mesh 42*b* having the same outer shape. The wires of the first mesh 42*a* and the second mesh 42*b* are rough. The second mesh 42*b* and the second mesh 40*b* are the same. An opening 42*aa* having a rectangular shape is formed in the center of the first mesh 42*a*. In the second mesh 42*b*, a single layer portion disposed in a range of the opening 42*aa* serves as the central portion 30*a*. A two-layer portion in which a portion of the first mesh 42*a* other than the opening 42*aa* and the second mesh 42*b* overlap each other serves as the peripheral portion 30*b*. That is, the first mesh 42*a* and the second mesh 42*b* are rough by itself, but are dense by overlapping two meshes.

As illustrated in FIG. 5(*c*), the mesh 30C according to the third specific example is formed of a first mesh 44*a* and a second mesh 44*b* having different outer shape sizes. The wires of the first mesh 44*a* are dense, and the wires of the second mesh 44*b* are rough. The first mesh 44*a* and the first mesh 40*a* are the same. An opening 44*aa* having a rectangular shape is formed in the center of the first mesh 44*a*. The second mesh 44*b* is fitted into the opening 44*aa* and serves as the central portion 30*a*. A portion of the first mesh 44*a* other than the opening 44*aa* serves as the peripheral portion 30*b*. With the meshes 30A to 30C, the first mesh and the second mesh may be partially fixed by adhesion, welding, or the like.

As illustrated in FIG. 5(*d*), the mesh 30D according to the fourth specific example is manufactured from a material mesh 46. The material mesh 46 has a central rectangular portion 46*a* that forms the outer shape of the mesh 30D, and protruding pieces 46*b* that protrude from the rectangular portion 46*a* in all directions. In the example illustrated in FIG. 5(*d*), among four protruding pieces 46*b*, the protruding pieces 46*b* that protrude in a left-right direction have the same width as the rectangular portion 46*a*, and the protruding pieces 46*b* that protrude in an up-down direction have a narrower width than the rectangular portion 46*a*. As illustrated by imaginary lines, all the four protruding pieces 46*b* may have, for example, the same trapezoidal shape.

The mesh 30D is manufactured by folding back the protruding pieces 46*b* inward along an edge portion 46*aa* of the rectangular portion 46*a*. A portion of the rectangular portion 46*a* that does not overlap the protruding pieces 46*b* that are folded back is the central portion 30*a*. The protruding pieces 46*b* that are folded back and the portion of the rectangular portion 46*a* that overlaps the protruding pieces 46*b* form the peripheral portion 30*b* of the two layers. As described above, the mesh 30D can be manufactured from one material mesh 46.

The mesh 30 is not limited to the specific examples 30A to 30D, and for example, the peripheral portion 30*b* of two layers in the specific examples 30A, 30B, 30D may be formed of three or more layers. In addition, for example, a portion corresponding to the central portion 30*a* in the mesh in which the wires on the entire surface are dense may be subjected to chemical treatment (for example, etching treatment), laser processing, or the like to make the density of the portion corresponding to the central portion 30*a* lower than the density of a portion corresponding to the peripheral portion 30*b*.

In addition, a porous material other than the mesh 30 may be used as the material that is interposed between the die 24 and the vapor chamber 16 and is impregnated with the liquid metal 32. Examples of the other porous material include sponge or paper. The sponge or the paper does not have a wire like the mesh 30 and, for example, the sponge is formed of a sponge-like foaming material or the like as a material. In a broad sense, the porous material according to the present example need only be formed such that the peripheral portion 30b has a higher material density per unit volume than the central portion 30a. The porous material may be formed by combining the sponge and the mesh.

In the heat radiation structure 10 and the portable information apparatus 12 configured as described above, the mesh 30 is interposed between the die 24 and the vapor chamber 16, and the mesh 30 is impregnated with the liquid metal 32. Therefore, the die 24 and the vapor chamber 16 have a low thermal resistance and are suitably thermally connected to each other, and heat of the die 24 is effectively radiated by the vapor chamber 16. Even in a case in which the surfaces of the die 24 and the vapor chamber 16 have microscopic irregularities, the liquid metal 32 can fill a space between the respective surfaces to reduce the thermal resistance.

In addition, since the liquid metal 32 is impregnated in the mesh 30, the liquid metal 32 does not leak to the periphery. In particular, the material density is high in the peripheral portion 30b of the mesh 30, a capillary action takes place, and the leakage of the liquid metal 32 can be further prevented.

On the other hand, the central portion 30a of the mesh 30 has a low material density and has a larger relative impregnation amount of the liquid metal per unit volume than the peripheral portion 30b in which the material density is high, and thus the heat transfer property is excellent. As described above, the heat radiation structure 10 and the portable information apparatus 12 can achieve both the suppression of the leakage of the liquid metal 32 and the realization of high heat transfer performance. In order to obtain high heat transfer property, it is desirable that a large area of the central portion 30a is ensured and a width of the peripheral portion 30b is reduced to such an extent that the liquid metal 32 is not scattered in a predetermined impact test. In addition, in a case in which the mesh 30 is made of the resin material, the mesh 30 itself is inferior in the heat transfer property, but in a case in which the central portion 30a is sufficiently impregnated with the liquid metal 32, it is possible to ensure high heat transfer property as a whole.

Figure 6:
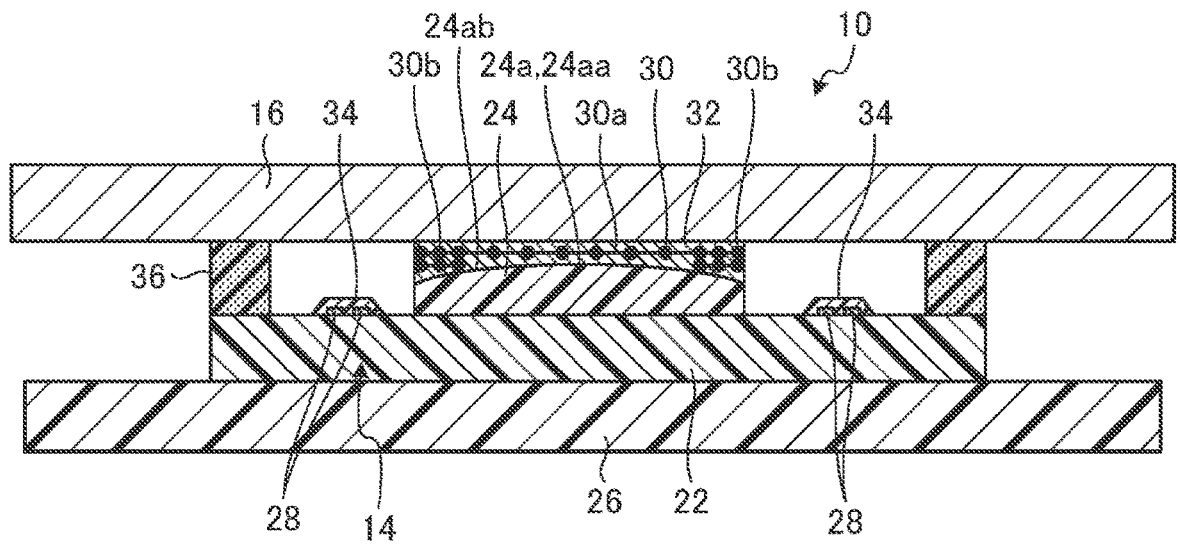
FIG. 6 is a schematic cross-sectional side view illustrating a second application example of the heat radiation structure.

FIG. 6 is a schematic cross-sectional side view illustrating a second application example of the heat radiation structure 10. The surface 24a of the die 24 is generally considered to be a flat surface, but as illustrated in FIG. 6, there is a case in which the central portion 24aa has a shape that is slightly raised from a periphery 24ab as a result of accurate measurement. In such a case, simply applying the liquid metal 32 between the die 24 and the vapor chamber 16 without the mesh 30 interposed therebetween tends to cause the liquid metal 32 to leak from the periphery 24ab. On the other hand, in the heat radiation structure 10 according to the present embodiment, the liquid metal 32 is impregnated in the mesh 30 and the material density is high in the peripheral portion 30b, so that the liquid metal 32 is less likely to leak. In addition, by applying the meshes 30A, 30B, and 30D in which the peripheral portion 30b is formed of two layers, the peripheral portion 30b has an action of filling a gap portion of the periphery 24ab, and thus the liquid metal 32 is less likely to leak.

Figure 7:
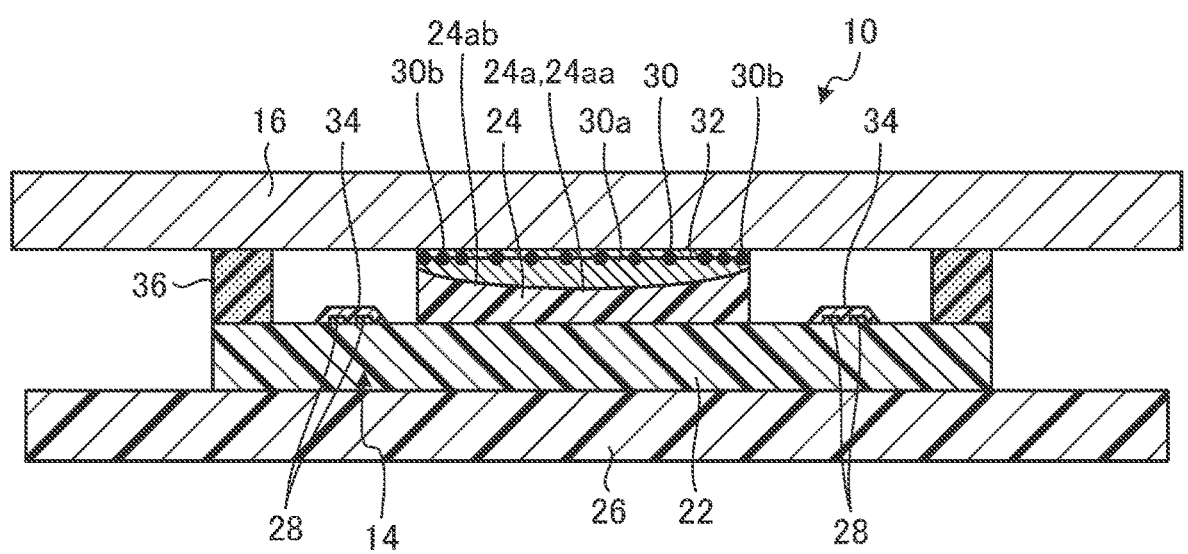
FIG. 7 is a schematic cross-sectional side view illustrating a third application example of the heat radiation structure.

FIG. 7 is a schematic cross-sectional side view illustrating a third application example of the heat radiation structure 10. The surface 24a of the die 24 is generally considered to be a flat surface, but as illustrated in FIG. 7, there is a case in which the central portion 24aa has a shape that is slightly recessed from the periphery 24ab as a result of accurate measurement. Even in a case in which the surface 24a has the recessed shape as described above, the mesh 30 interposed between the die 24 and the vapor chamber 16 can effectively prevent the liquid metal 32 from leaking.

The present invention is not limited to the above-described embodiment, and there is no doubt that the present invention can be freely changed without departing from the gist of the present invention.

The invention claimed is:

1. A heat radiation structure of an electric component that generates heat, the heat radiation structure comprising:
   a heat radiation element along a surface of the electric component;
   a porous material between the electric component and the heat radiation element; and
   a liquid metal impregnated in the porous material,
   wherein, in the porous material, a peripheral portion has a higher material density per unit volume than a central portion.

2. The heat radiation structure according to claim 1, wherein the porous material is a mesh.

3. The heat radiation structure according to claim 2, wherein, in the mesh, the central portion is formed of a single layer, and the peripheral portion is formed of a plurality of layers.

4. The heat radiation structure according to claim 3, wherein a material of the mesh that is folded back at an edge portion of the mesh is the peripheral portion.

5. The heat radiation structure according to claim 2, wherein the mesh is a resin material.

6. The heat radiation structure according to claim 1, further comprising:
   a board; and
   a semiconductor chip mounted on the board,
   wherein the semiconductor chip includes a substrate and a die, and
   the electric component is the die.

7. The heat radiation structure according to claim 6, wherein a surface of the die has a shape in which a central portion thereof is raised from a periphery thereof.

8. An electronic apparatus comprising:
   an electric component that generates heat;
   a heat radiation element along a surface of the electric component;
   a porous material between the electric component and the heat radiation element; and
   a liquid metal impregnated in the porous material,
   wherein, in the porous material, a peripheral portion has a higher material density per unit volume than a central portion.

* * * * *